(12) United States Patent
Mochizuki et al.

(10) Patent No.: US 10,998,204 B2
(45) Date of Patent: May 4, 2021

(54) METHOD OF PROCESSING SUBSTRATE AND SUBSTRATE PROCESSING APPARATUS

(71) Applicant: TOKYO ELECTRON LIMITED, Tokyo (JP)

(72) Inventors: Takashi Mochizuki, Nirasaki (JP); Toshiaki Fujisato, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 65 days.

(21) Appl. No.: 16/412,843

(22) Filed: May 15, 2019

(65) Prior Publication Data

US 2019/0355597 A1 Nov. 21, 2019

(30) Foreign Application Priority Data

May 17, 2018 (JP) .............................. JP2018-095727

(51) Int. Cl.
| | |
|---|---|
| *H01L 21/67* | (2006.01) |
| *H01L 21/683* | (2006.01) |
| *H01J 37/32* | (2006.01) |
| *C23C 16/42* | (2006.01) |
| *C23C 16/52* | (2006.01) |
| *C23C 16/46* | (2006.01) |
| *C23C 16/02* | (2006.01) |
| *H01L 21/02* | (2006.01) |

(52) U.S. Cl.
CPC .... *H01L 21/67103* (2013.01); *C23C 16/0245* (2013.01); *C23C 16/42* (2013.01); *C23C 16/463* (2013.01); *C23C 16/52* (2013.01); *H01J 37/32724* (2013.01); *H01L 21/67028* (2013.01); *H01L 21/67069* (2013.01); *H01L 21/6833* (2013.01); *H01J 2237/002* (2013.01); *H01J 2237/334* (2013.01); *H01L 21/02068* (2013.01)

(58) Field of Classification Search
None
See application file for complete search history.

(56) References Cited

U.S. PATENT DOCUMENTS

2019/0355597 A1* 11/2019 Mochizuki ........ H01J 37/32724

FOREIGN PATENT DOCUMENTS

| JP | 2011-077452 A | 4/2011 |
|---|---|---|
| JP | WO2015115002 A1 | 3/2017 |
| KR | 1020170131219 A | 11/2017 |

* cited by examiner

*Primary Examiner* — Jack S Chen
(74) *Attorney, Agent, or Firm* — Nath, Goldberg & Meyer; Jerald L. Meyer

(57) ABSTRACT

There is provided a method of processing a substrate by a substrate processing apparatus including a substrate mounting table having a refrigerant passage and a heater, and a chiller. The method includes adjusting a temperature of the substrate mounting table to a first temperature to process the substrate; and adjusting the temperature of the substrate mounting table to a second temperature higher than the first temperature to process the substrate. The temperature of the substrate mounting table becomes the second temperature by allowing the refrigerant at a first flow rate to flow from the chiller to the refrigerant passage and operating the heater. The temperature of the substrate mounting table becomes the first temperature by allowing the refrigerant at a second flow rate larger than the first flow rate to flow from the chiller to the refrigerant passage and operating the heater, or stopping an operation of the heater.

11 Claims, 10 Drawing Sheets

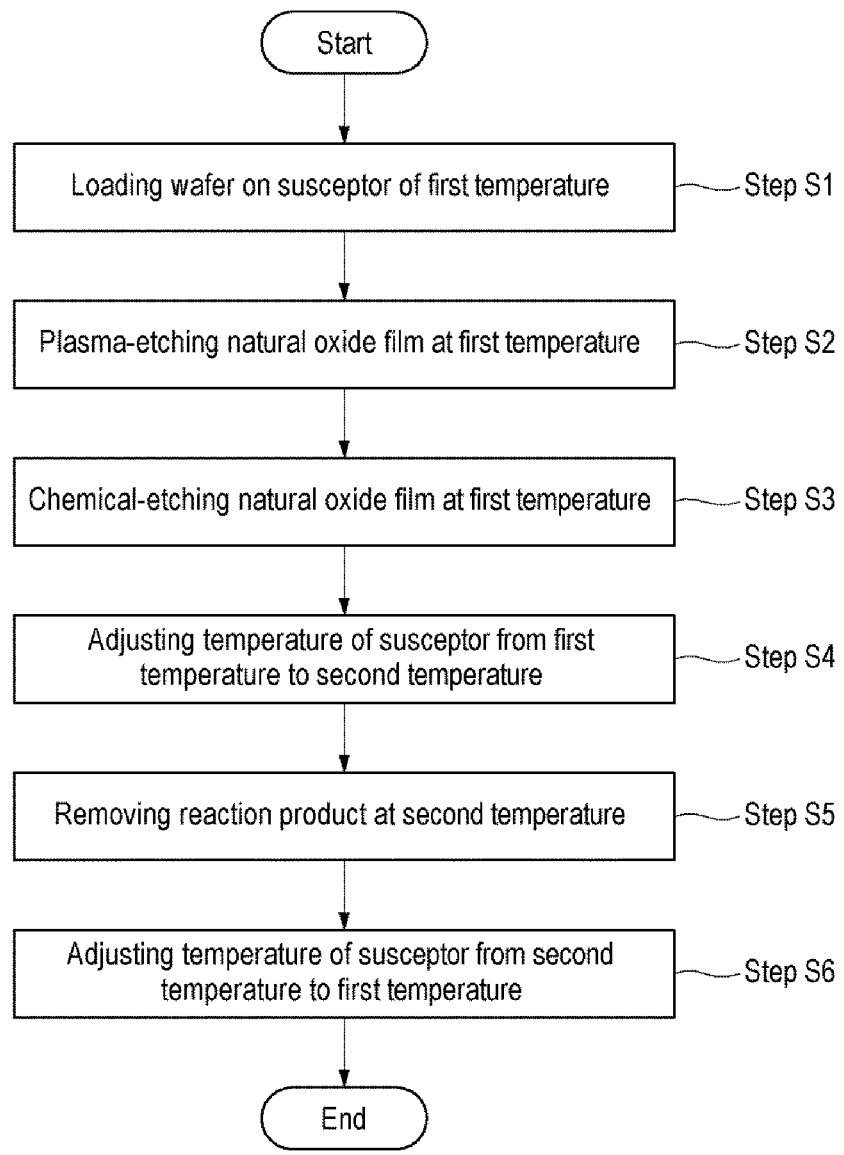

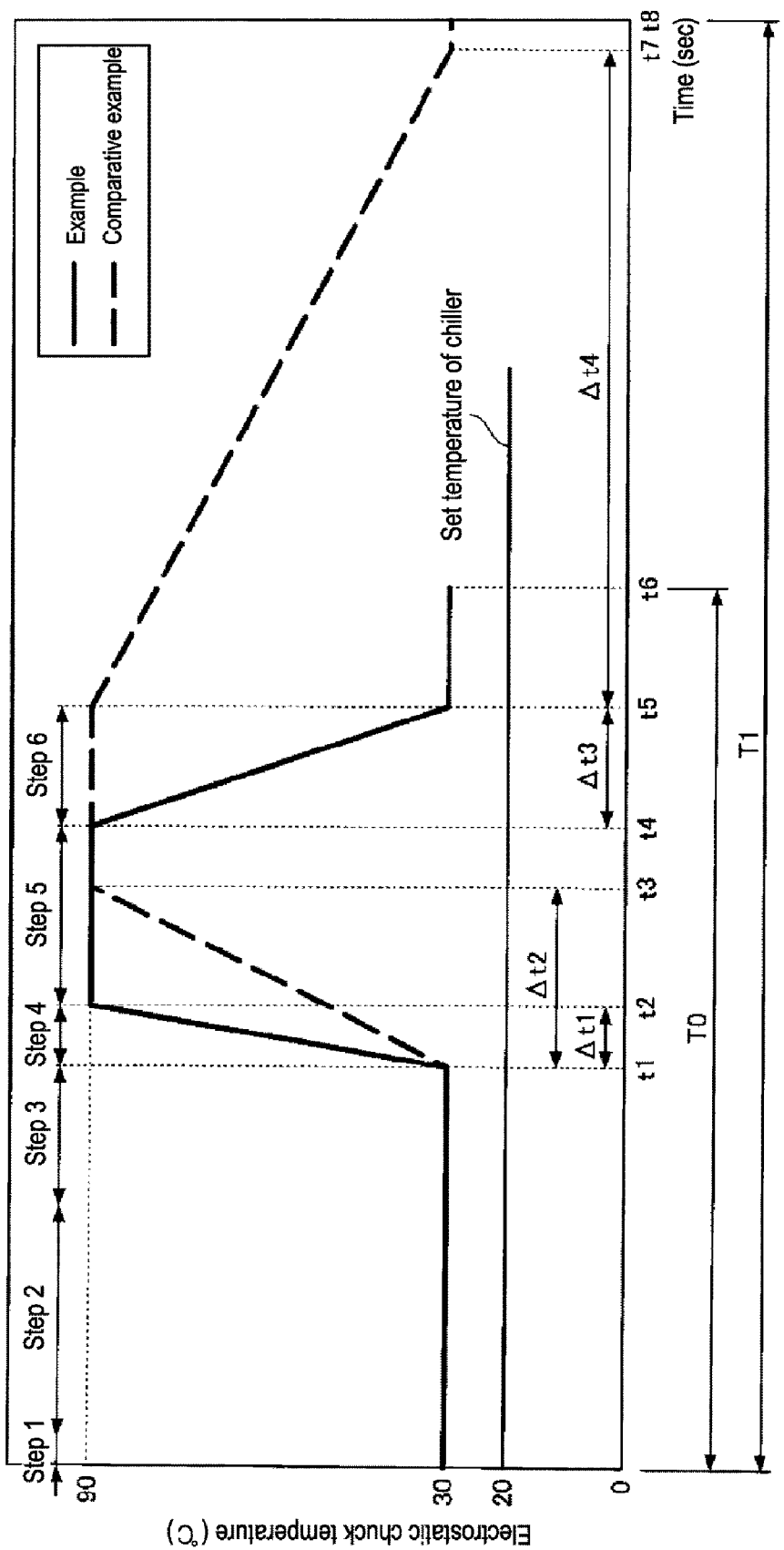

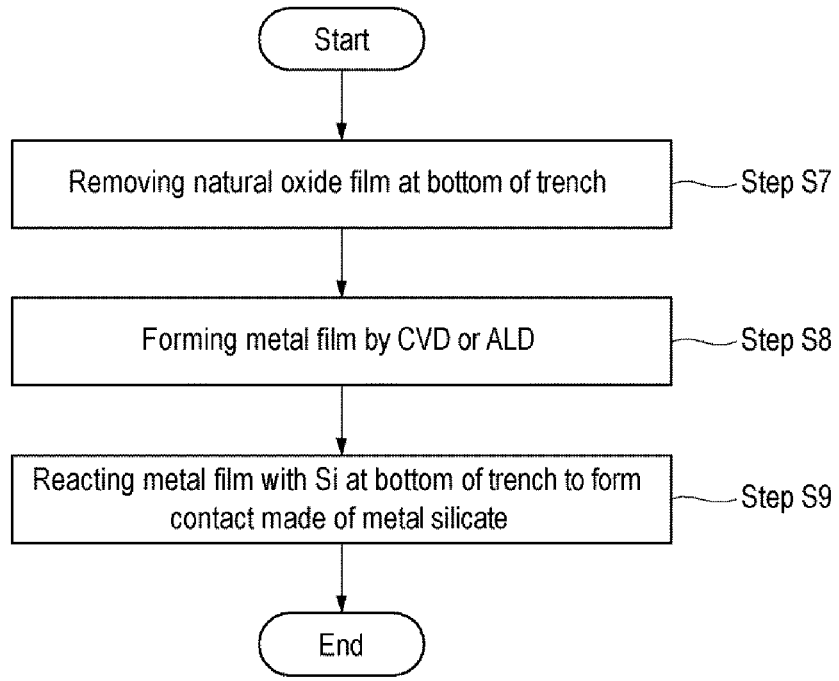
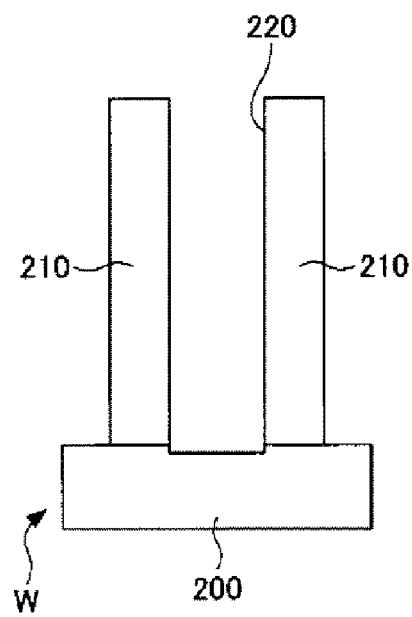

METHOD OF PROCESSING SUBSTRATE AND SUBSTRATE PROCESSING APPARATUS

CROSS-REFERENCE TO RELATED APPLICATION

This application is based upon and claims the benefit of priority from Japanese Patent Application No. 2018-095727, filed on May 17, 2018, the entire contents of which are incorporated herein by reference.

TECHNICAL FIELD

The present disclosure relates to a method of processing a substrate and a substrate processing apparatus.

BACKGROUND

A related art discloses a temperature control method of a substrate mounting table, which mounts a substrate on the substrate mounting table in which a heater and a refrigerant passage are embedded, lowers the temperature of the substrate mounting table by supplying a refrigerant to the refrigerant passage and raises the temperature of the substrate mounting table by causing the heater to generate heat. In this temperature control method, the temperature of the substrate can be promptly raised by stopping the flow of the refrigerant when the heater generates heat.

SUMMARY

Some embodiments of the present disclosure provide a method of processing a substrate and a substrate processing apparatus, which are advantageous for shortening throughput by reducing a temperature rising time and a temperature dropping time of a substrate mounting table, in performing a plurality of processes with different temperatures of the substrate mounting table.

According to one embodiment of the present disclosure, there is provided a method of processing a substrate by a substrate processing apparatus including a substrate mounting table arranged in a process container and including a refrigerant passage through which a refrigerant flows and a heater embedded therein, and a chiller configured to circulate the refrigerant with the refrigerant passage. The method includes: adjusting a temperature of the substrate mounting table to a first temperature to process the substrate; and adjusting the temperature of the substrate mounting table to a second temperature higher than the first temperature to process the substrate, wherein when the temperature of the substrate mounting table is adjusted from the first temperature to the second temperature, the refrigerant at a first flow rate for maintaining a set temperature of the chiller is allowed to flow from the chiller to the refrigerant passage and the heater is operated so that the temperature of the substrate mounting table becomes the second temperature, and when the temperature of the substrate mounting table is adjusted from the second temperature to the first temperature, the refrigerant at a second flow rate larger than the first flow rate is allowed to flow from the chiller to the refrigerant passage and the heater is operated, or an operation of the heater is stopped so that the temperature of the substrate mounting table becomes the first temperature.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a flowchart of an example of a substrate processing method according to the first embodiment.

FIGS. 4A and 4B are diagrams illustrating an example of a process sequence of an example of the substrate processing method together with an example of a process sequence of a conventional example, in which FIG. 4A is a time-varying graph of a refrigerant flow rate and FIG. 4B is a time-varying graph of an electrostatic chuck temperature.

FIG. 5 is a flowchart of a substrate processing method including the first embodiment.

FIGS. 6A to 6C are cross-sectional process views illustrating respective steps of a flowchart of the substrate processing method including the first embodiment.

DETAILED DESCRIPTION

Figure 1:
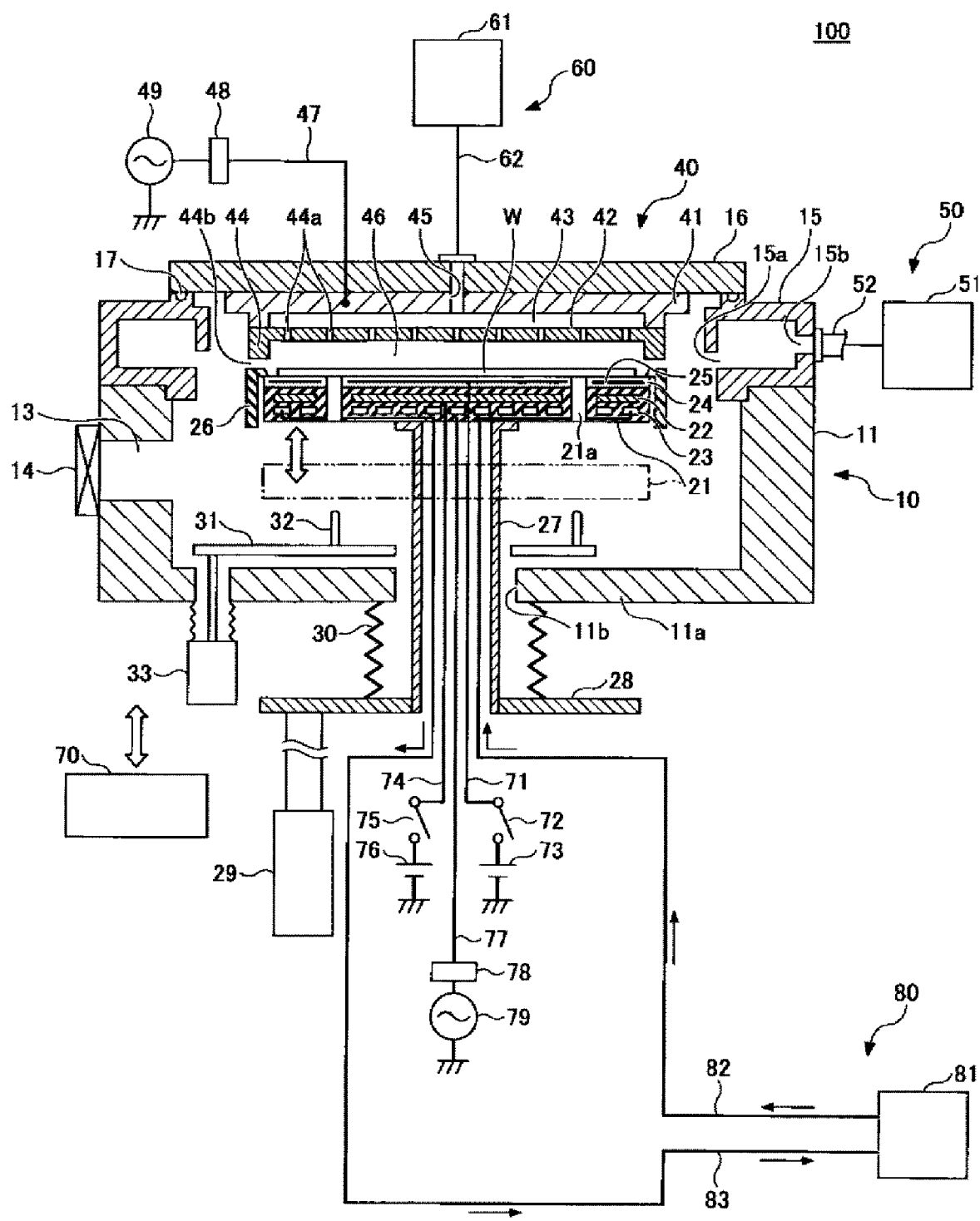
FIG. 1 is a cross-sectional view illustrating an example of an overall configuration of a substrate processing apparatus according to a first embodiment of the present disclosure.

Hereinafter, a method of processing a substrate and a substrate processing apparatus according to an embodiment of the present disclosure will be described with reference to the drawings. Further, in the present disclosure and the drawings, substantially like components are given like reference numerals and a repeated description thereof will be omitted. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

<Substrate Processing Apparatus>

First, an example of a substrate processing apparatus according to a first embodiment of the present disclosure will be described with reference to FIG. 1. FIG. 1 is a cross-sectional view illustrating an example of an overall configuration of the substrate processing apparatus according to the first embodiment. A substrate processing apparatus 100 illustrated in FIG. 1 is an apparatus in which a plasma etching process, a chemical etching process, and a removal process of removing a reaction product generated by the chemical etching process can be sequentially executed in one process container 10. Furthermore, the substrate processing apparatus 100 is an apparatus in which, subsequent to the removal process of removing a reaction product, a film may be formed by, for example, an atomic layer deposition (ALD) method or a chemical vapor deposition (CVD) method.

The substrate processing apparatus 100 illustrated in FIG. 1 includes a process container 10 as a chamber, a substrate mounting table 21 (hereinafter, referred to as a "susceptor") arranged in the process container 10 and having a substrate W (hereinafter, a semiconductor wafer as an example of the substrate W will be referred to as a "wafer") mounted thereon, and a shower head 40. Furthermore, the substrate processing apparatus 100 includes a processing gas supply 60 that supplies a processing gas to the shower head 40, and an exhauster 50 which exhausts various kinds of processing gases from the interior of the process container 10, and further vacuumizes the interior of the process container 10 to be depressurized. In addition, the substrate processing apparatus 100 includes a cooler 80 that circulates a refrigerant with the susceptor 21, and a controller 70 that controls the respective configuration parts.

The process container 10 is made of a metal such as aluminum and has a container body 11 with a substantially cylindrical shape, and the container body 11 has a bottom plate 11a. A loading/unloading port 13 for loading and unloading the wafer W is installed on a sidewall of the container body 11 and the loading/unloading port 13 is configured to be opened and closed by a gate valve 14. An annular exhaust duct 15 having a substantially rectangular cross-sectional shape is disposed above the container body 11. A slit 15a is formed in the exhaust duct 15 along its inner peripheral surface. Furthermore, an exhaust port 15b is formed on an outer wall of the exhaust duct 15. A ceiling plate 16 for closing the upper opening of the container body 11 is installed on an upper surface of the exhaust duct 15. A seal ring 17 is disposed at a contact interface between the ceiling plate 16 and the exhaust duct 15 so that the ceiling plate 16 and the exhaust duct 15 are sealed airtight by the seal ring 17.

The susceptor 21 on which the wafer W is mounted is formed shaped in a disc having a size corresponding to the wafer W and is supported by a cylindrical support 27. The susceptor 21 is made of a ceramic material such as aluminum nitride (AlN) or a metal material such as aluminum or a nickel alloy. A heater 22 and a refrigerant passage 23 through which a refrigerant flows are embedded in the susceptor 21.

The heater 22 is connected to a DC power supply 76 via a power supply line 74 installed to extend inside the cylindrical support 27, and a switch 75 is interposed in the power supply line 74. When the switch 75 receives an ON signal from the controller 70 during the process, the switch 75 is turned on and a DC voltage is applied from the DC power supply 76 to the heater 22 so that the heater 22 which acts as a resistor is heated. The heater 22 may be made of, for example, tungsten, molybdenum, or a compound of any one of these metals and alumina ($Al_2O_3$), titanium or the like.

The refrigerant passage 23 has a linear shape that is a spiral linear shape or that is a meandering shape combining a plurality of straight portions and curved portions connecting each end of the respective straight portions, when viewed from the plane. Both ends of the refrigerant passage 23 are in fluid communication with a feed passage 82 and a return passage 83 which are installed to extend inside the support 27 and communicate with a chiller 81.

A high frequency power supply 79 for plasma generation is connected to the susceptor 21 via a power supply line 77 installed to extend inside the cylindrical support 27. A matching device 78 for impedance matching is interposed in the power supply line 77 on the upstream side of the high frequency power supply 79. The susceptor 21 functions as a lower electrode. On the other hand, the shower head 40 as described hereinbelow functions as an upper electrode and forms a pair of parallel plate electrodes together with the susceptor 21.

In a state where the susceptor 21 is located at a processing position as indicated by a solid line in FIG. 1, a process space 46 is formed between the shower head 40 and the susceptor 21. By applying a high frequency power from the high frequency power supply 79 to the susceptor 21, capacitively coupled plasma is generated in the process space 46. Furthermore, by applying a high frequency power from the high frequency power supply 79 to the susceptor 21, ions in the plasma are implanted into the wafer W. It is desirable that the frequency of the high frequency power output from the high frequency power supply 79 be set within a range of 0.1 to 500 MHz, and in an exemplary embodiment the frequency of 13.56 MHz is applied.

An electrostatic chuck 24 having a mounting surface on which the wafer W is directly mounted is mounted on the upper surface of the susceptor 21. The electrostatic chuck 24 is an insulator made of ceramics such as alumina, and includes an electrode 25 having an electrostatic adsorption function embedded therein. The electrode 25 is connected to the DC power supply 73 via a power supply line 71 installed to extend inside the cylindrical support 27, in which a switch 72 is interposed in the power supply line 71. When the switch 72 is turned on, a Coulomb force is generated by applying a DC voltage from the DC power supply 73 to the electrode 25, and the wafer W is electrostatically adsorbed to the upper surface of the electrostatic chuck 24 by the Coulomb force. The thickness of the electrostatic chuck 24 is set to, for example, about 3 to 4 mm.

A temperature sensor such as a thermocouple (not shown) is disposed on the upper surface of the electrostatic chuck 24 (the mounting surface of the wafer W) so that the temperature sensor frequently monitors the temperature of the upper surface of the electrostatic chuck 24 and the temperature of the wafer W. This monitor information is frequently transmitted to the controller 70 so that the controller 70 executes the temperature adjustment control of the susceptor 21 and the wafer W based on the monitor information. More specifically, the controller 70 executes the ON/OFF control of the switch 75 or the temperature control of the heater 22. Furthermore, the controller 70 can continuously control the temperatures of the susceptor 21 and the wafer W between a first temperature and a second temperature by adjusting the flow rate of a refrigerant supplied from the chiller 81 to the refrigerant passage 23 within a range between a first flow rate and a second flow rate and circulating the flow rate-adjusted refrigerant to the refrigerant passage 23. In addition, for example, a heat transfer gas such as an He gas is supplied from a heat transfer gas supply via a supply passage (none of which are shown) between the electrostatic chuck 24 and the wafer W so that the temperature of the susceptor 21, which is temperature-adjusted and controlled, is rapidly transferred to the wafer W via the heat transfer gas to perform the temperature adjustment control of the wafer W.

An annular shield body 26 configured to cover the outer peripheral region of the electrostatic chuck 24 and the side surface of the susceptor 21 is provided on the side surface of the disc-shaped susceptor 21 with a slight gap from the electrostatic chuck 24. The shield body 26 is made of ceramics such as alumina and quartz. The shield body 26 has a function of shielding plasma that prevents the plasma generated in the process space 46 by the high frequency power from the high frequency power supply 79 from leaking inside the container body 11.

The support 27 supporting the susceptor 21 extends from the center of the bottom surface of the susceptor 21 to the lower side of the container body 11 through an opening 11b formed in the bottom plate 11a of the container body 11, and a lower end of the support 27 is connected to a support plate 28. The support plate 28 is configured to be moved up and down along a guide body (not shown) by an elevator 29.

Furthermore, a bellows 30, which surrounds the support plate 28, blocks the internal atmosphere of the process container 10 from the outside air, and expands and contracts according to an elevation operation of the susceptor 21, is disposed between the bottom plate 11a of the container body 11 and the support plate 28.

An elevating plate 31 is disposed near the bottom plate 11a of the container body 11, and three (only two of which are shown) wafer support pins 32 protruding upward are provided on an upper surface of the elevating plate 31. The elevating plate 31 is supported to be moved up and down by an elevator 33 disposed below the bottom plate 11a of the container body 11 so that the wafer support pins 32 can be lifted and lowered according to an elevation operation of the elevating plate 31. When the susceptor 21 is located at a transfer position indicated by a two-dot chain line, if the wafer support pins 32 are lifted and lowered, the wafer support pins 32 are configured to protrude and retract from the upper surface of the susceptor 21 via through holes 21a provided in the susceptor 21. By lifting and lowering the wafer support pins 32 in this way, the wafer W is transferred between a wafer transfer part (not shown) and the susceptor 21.

The shower head 40 includes a body section 41 having substantially the same diameter as that of the susceptor 21 and fixed to the ceiling plate 16, and a shower plate 42 connected to the lower side of the body section 41 and facing the susceptor 21. A gas dispersion space 43 is formed between the body section 41 and the shower plate 42, and a gas introduction hole 45, which penetrates the center of the body section 41 and the ceiling plate 16, is formed to be opened to the gas dispersion space 43. The body section 41 and the shower plate 42 are both made of a metal such as, for example, aluminum, and a thermal spray coating film made of yttria ($Y_2O_3$) or the like may be formed on the surface of the metal body. An annular protrusion 44 protruding downward is formed in a peripheral edge portion of the shower plate 42 and an annular gap 44b is formed by the annular protrusion 44 and the upper surface of the shield body 26 of the susceptor 21 approaching each other. In the shower plate 42, gas discharge holes 44a are formed on an inner flat surface of the annular protrusion 44. The processing gas supplied to the gas dispersion space 43 via the gas introduction hole 45 is supplied to the process space 46 in a shower shape via the plurality of gas discharge holes 44a.

A high frequency power supply 49 for plasma generation is connected to the body section 41 via a power supply line 47 in which a matching device 48 for impedance matching is interposed, and the shower head 40 functions as an upper electrode. By applying a high frequency power from the high frequency power supply 49 to the body section 41, ions in the plasma are provided to the wafer W. It is desirable that the frequency of the high frequency power output from the high frequency power supply 49 be set within a range of 0.1 to 500 MHz, and may be set identical to or different from that of the high frequency power supply 79. Furthermore, during the process, the high frequency power may be applied from both the high frequency power supplies 49 and 79, or the high frequency power may be applied from either the high frequency power supply 49 or 79.

The processing gas supply 60 has a plurality of processing gas supply sources 61 that individually supply a plurality of processing gases applied to a plurality of processes continuously performed in the substrate processing apparatus 100, and a plurality of processing gas supply pipes 62 that receive the respective processing gases supplied from the plurality of processing gas supply sources 61. Furthermore, in FIG. 1, only one processing gas supply source 61 and one processing gas supply pipe 62 are extracted and illustrated. An opening/closing valve and a flow rate controller such as a mass flow controller (none of which are shown) are provided in each processing gas supply pipe, and the switching of the kind of processing gas and the flow rate control of the processing gas are executed by the opening/closing valve and the mass flow controller. The processing gas supplied through the processing gas supply pipe 62 is supplied to the shower head 40 via the gas introduction hole 45.

The exhauster 50 exhausts the interior of the process container 10. The exhauster 50 includes an exhaust pipe 52 connected to the exhaust port 15b of the exhaust duct 15 and an exhaust mechanism 51 connected to the exhaust pipe 52, and the exhaust mechanism 51 includes a turbo molecular pump, a dry pump, a pressure control valve, an opening/closing valve, and the like (none of which are shown). During the exhaust process, the gas in the container body 11 reaches the exhaust duct 15 via the slit 15a and is exhausted from the exhaust duct 15 via the exhaust pipe 52 by the exhaust mechanism 51 of the exhauster 50. During a process in which the interior of the process container 10 is set at a high pressure, exhaust is performed only by, for example, the dry pump. On the other hand, during a process in which the process container 10 is set at a low pressure, exhaust is performed by using both the dry pump and the turbo molecular pump. A pressure sensor (not shown) is provided in the process container 10, and the internal pressure of the process container 10 is controlled by controlling the opening degree of the pressure control valve based on a detection value of the pressure sensor.

The cooler 80 includes the chiller 81, and the feed passage 82 and the return passage 83 which are in fluid communication with the chiller 81. Both the feed passage 82 and the return passage 83 are installed to extend inside the cylindrical support 27 to the susceptor 21 side and the fluid may be in communication with both ends of the spiral refrigerant passage 23 embedded in the susceptor 21. The chiller 81 includes a body section for controlling the temperature of a refrigerant and a pump for pressure-feeding the refrigerant (none of which are shown). The flow rate of the refrigerant pressure-fed from the pump is variably controlled by the controller 70 during the process. Here, Galden (registered trademark), Fluorinert (registered trademark), or the like may be used as the refrigerant.

In the substrate processing apparatus 100, a first process in which the process is performed in the process container 10 by setting the susceptor 21 at the first temperature and a second process in which the process is performed by setting the susceptor 21 at the second temperature higher than the first temperature are sequentially executed. The first temperature and the second temperature may be set at various temperatures according to the process. For example, the relatively high second temperature may be set within a range of 90 to 150 degrees C., and a difference value between the second temperature and the first temperature may be set within a range of 20 to 100 degrees C.

A substrate processing method of unloading a wafer W, which has been processed by performing the first process and the second process as a series of processes upon one wafer W, from the process container 10, loading an unprocessed wafer W into the process container 10, and similarly performing the first process and the second process, may be applied. According to the substrate processing method in which a plurality of processes with different temperatures of the susceptor 21 are sequentially performed in one process container 10 as described above, it is possible to simplify the processing facility, reduce the size of the processing facility, and further reduce the cost required for manufacturing a device, compared with a method in which each process is performed in a different process container. On the other hand, when the plurality of processes with different temperatures are performed in one process container 10, the time required for switching the temperature of the susceptor 21 may be a rate-limiting step of the process, and thus the process time may be prolonged based on the delay required for switching the temperature of the susceptor 21. In order to shorten the time required for switching the temperature of the susceptor 21 and shorten the throughput, the temperature of the chiller 81 is maintained at a predetermined set temperature during the process. Specifically, a control is performed such that the flow rate of the refrigerant capable of guaranteeing the upholding of the set temperature for the chiller 81 is computed in advance, and the refrigerant is circulated at a flow rate equal to or larger than the computed flow rate between the cooler 80 and the refrigerant passage 23.

The controller 70 controls operations of the respective components of the substrate processing apparatus 100, for example, the heater 22 and the chiller 81 embedded in the susceptor 21, the high frequency power supplies 49 and 79, the processing gas supply 60, the exhauster 50, and the like. The controller 70 has a central processing unit (CPU), a read only memory (ROM), and a random access memory (RAM). The CPU executes a predetermined process according to a recipe (process recipe) stored in a memory area such as an RAM. Control information about process conditions of the substrate processing apparatus 100 is set in the recipe. The control information includes, for example, the gas flow rate, the internal pressure of the process container 10, the internal temperature of the process container 10, the temperature of the mounting surface of the electrostatic chuck 24, the process time, and the like. In one embodiment, as will be described in detail below, the recipe includes a process of continuously controlling the susceptor 21 from the first temperature to the second temperature. Furthermore, the recipe includes sequential processes of a plasma etching process, a chemical etching process, and a process of removing a reaction product for a predetermined time.

An example of the control flow by the controller 70 is as follows. First, when the temperature of the susceptor 21 is adjusted from the first temperature to the second temperature, a process of allowing the refrigerant at the first flow rate for maintaining the set temperature of the chiller 81 to flow from the chiller 81 to the refrigerant passage 23 and setting the temperature of the susceptor 21 to the second temperature by operating the heater 22, is executed. On the other hand, when the temperature of the susceptor 21 is adjusted from the second temperature to the first temperature, a process of allowing the refrigerant at the second flow rate larger than the first flow rate to flow from the chiller 81 to the refrigerant passage 23 and setting the temperature of the susceptor 21 to the first temperature by operating the heater 22 or stopping the operation of the heater 22.

Furthermore, a program applied by the recipe and the controller 70 may be stored in, for example, a hard disk, a compact disc, a magneto-optical disk, or the like. In addition, the recipe or the like may be in the form that is set in the controller 70 by being stored in a storage medium readable by a portable computer such as a CD-ROM, a DVD, a memory card or the like, and that is read out. The controller 70 also has a user interface, such as an input device such as a keyboard or a mouse for performing an input operation of a command or the like, a display device such as a display for visually displaying the operation state of the substrate processing apparatus 100, and an output device such as a printer.

<Substrate Processing Method>

Figure 3A:
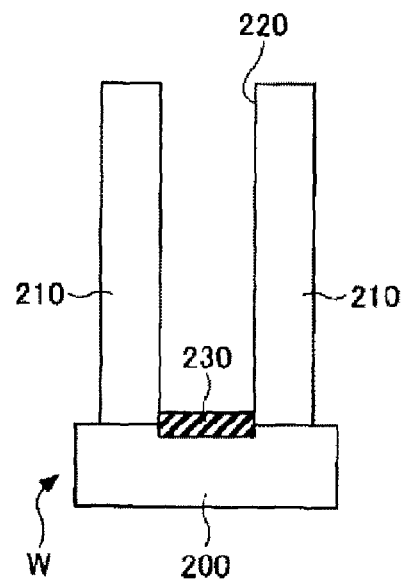
FIGS. 3A to 3E are cross-sectional process views illustrating respective steps of the flowchart of an example of the substrate processing method.

Next, an example of a substrate processing method of processing a wafer W using the substrate processing apparatus 100 illustrated in FIG. 1 will be described with reference to FIGS. 2 to 4. FIG. 2 is a flowchart of an example of a substrate processing method according to the first embodiment, and FIGS. 3A to 3E are cross-sectional process views illustrating respective steps of the flowchart of an example of the substrate processing method. Further, FIGS. 4A to 4B are diagrams illustrating an example of a process sequence of an example of the substrate processing method together with an example of a process sequence of a conventional example, where FIG. 4A is a time-varying graph of a refrigerant flow rate and FIG. 4B is a time-varying graph of an electrostatic chuck temperature. Further, FIGS. 4A and 4B are illustrated with the time axes aligned.

The time-varying graph of the refrigerant flow rate in FIG. 4A is a graph in which the refrigerant flow rate actually varies. The switching of the flow rate of the refrigerant to the chiller 81 by the controller 70 may be performed by, for example, a proportional integral differential (PID) control. In this PID control, a command signal is transmitted from the controller 70 to the chiller 81 at various timings. For example, in FIG. 4A, there may be a timing at which a command signal for increasing the flow rate is transmitted at time t2, and a command signal for reducing the flow rate is transmitted at time t9.

Since the temperature of the electrostatic chuck 24 directly reflects the temperature of the heater 22 embedded in the electrostatic chuck 24, it may be assumed that the time-varying graph of the electrostatic chuck temperature illustrated in FIG. 4B represents the time-varying graph of the temperature of the heater embedded in the electrostatic chuck 24 as is. Furthermore, the temperature of the electrostatic chuck 24 may be the temperature of the wafer W mounted on the electrostatic chuck 24 as is. In addition, in FIGS. 4A and 4B, the graph of an example indicated by a solid line and the graph of a comparative example (conventional example) indicated by a dotted line are indicated together, but in the following description of the process, the graph of the example indicated by the solid line will be referred to.

The substrate processing method illustrated in FIG. 2 includes a first processing step of adjusting the temperature of the susceptor 21 to a first temperature to process the wafer W, and a second processing step of adjusting the temperature of the susceptor 21 to a second temperature higher than the first temperature to process the wafer W. In FIG. 2, a step (step S1) of mounting the wafer W on the susceptor 21 of the first temperature, a step (step S2) of plasma-etching a natural oxide film at the first temperature, and a step (step S3) of chemical-etching the natural oxide film at the first temperature become the first processing step. Next, a step (step S5) of removing a reaction product at the second temperature after a step (step S4) of adjusting the temperature of the susceptor 21 from the first temperature to the second temperature becomes the second processing step. After the second processing step, a series of processes for one wafer W is completed through a step (step S6) of adjusting the temperature of the susceptor 21 from the second temperature to the first temperature. The substrate processing apparatus 100 illustrated in FIG. 1 is an apparatus configured to perform this series of processes in one process container 10 and sequentially perform these processes upon a plurality of wafers W.

The second temperature of the susceptor 21 in the second processing step is set within a range of 90 to 150 degrees C. and the difference value between the second temperature and the first temperature in the first processing step is set within a range of 20 to 100 degrees C. For example, in a wafer W (silicon wafer) in which an insulating film having a trench of a predetermined pattern (which is an example of a groove and a hole as another example of the groove) is formed on its surface, there is a film forming step of forming a contact by forming a contact metal film in a silicon portion at the bottom of the trench. In this film forming step, a silicon-containing oxide film which is a natural oxide film may be formed on the surface of the silicon portion. Therefore, a substrate processing method which performs a process of removing the silicon oxide film which is the natural oxide film by sequentially performing the first processing step and the second processing step will be described below. Here, it is assumed that, as an example, the temperature of the susceptor 21 in the first processing step may be set at 30 degrees C. (which is an example of the first temperature), and the temperature of the susceptor 21 in the second processing step may be set at 90 degrees C. (which is an example of the second temperature). That is, in FIG. 4B, the scope of the temperature of the electrostatic chuck at 30 degrees C. corresponds to the first processing step, and the scope of the temperature of the electrostatic chuck at 90 degrees C. corresponds to the second processing step.

As illustrated in FIG. 2, the wafer W is mounted on the susceptor 21 whose temperature is adjusted to the first temperature in step S1. In step S1, as illustrated in FIGS. 4A and 4B, by supplying a refrigerant at 10 L/min (which is an example of the first flow rate) from the chiller 81 to the refrigerant passage 23 and keeping the heater 22 at a low temperature of about 30 degrees C., the temperature of the susceptor 21 is adjusted to the first temperature. The wafer W is loaded into the process container 10, and the wafer W is mounted on (the electrostatic chuck 24 mounted on) the susceptor 21 whose temperature is adjusted to the first temperature. Here, as illustrated in FIG. 3A, an insulating film 210 is formed on a silicon base 200 of a wafer W, and a trench 220 having a predetermined pattern is formed in the insulating film 210. A natural oxide film (silicon-containing oxide film) 230 is formed on the silicon portion at the bottom of the trench 220. The insulating film 210 is mainly formed of an $SiO_2$ film, but a portion thereof may be an SiN film.

In one embodiment, a wafer W forming a fin FET may be an example of such a wafer W. The wafer W forming the fin FET includes a polygonal epitaxial growth portion made of Si or SiGe formed at a leading end of an Si fin as a silicon portion at the bottom of the trench 220, and this epitaxial growth portion forms a source and a drain. Then, the natural oxide film 230 may be formed on the surface of the epitaxial growth portion.

Figure 3B:
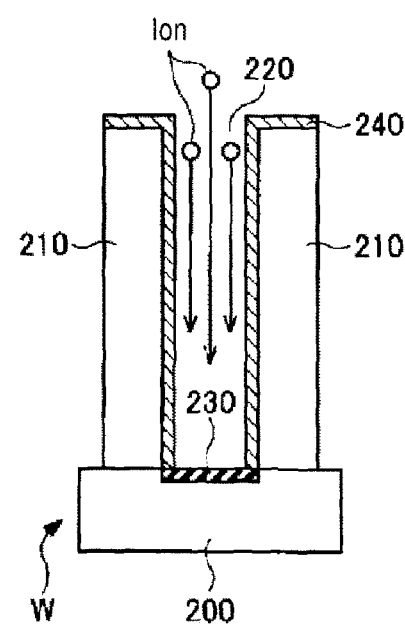
Figure 4A:
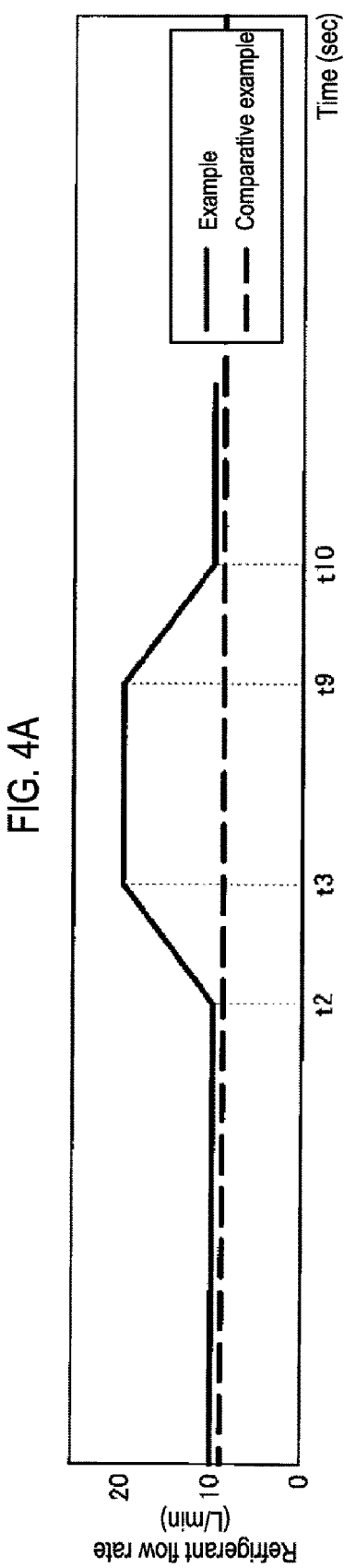

Next, as illustrated in FIG. 3B, in step S2, with the wafer W kept at the first temperature, an ionic anisotropic etching by plasma of a carbon-containing gas is performed to plasma-etch a portion of the oxide film 230 at the bottom of the trench 220. This step is an anisotropic etching utilizing ion straightness, and is performed by generating plasma in the process space 46 by means of applying a high frequency power from the high frequency power supply 79 to the susceptor 21 while supplying the carbon-containing gas from the processing gas supply 60 to the process space 46 of the process container 10 through the shower head 40. As the carbon-containing gas, it may be possible to use a fluorocarbon-based ($C_xF_y$-based) gas such as a tetrafluoromethane ($CF_4$) gas or an octafluorocyclobutane ($C_4F_8$) gas. Furthermore, it may be possible to use a fluorinated hydrocarbon-based ($C_xH_yF_z$-based) gas such as a difluoromethane ($CH_2F_2$) gas or the like. Also, in addition to these gases, a rare gas such as an argon (Ar) gas or an inert gas such as a nitrogen ($N_2$) gas may be used.

By using the aforementioned gases, since a carbon-based protective film 240 is formed on the sidewall of the trench 220 during the anisotropic etching, it is possible to etch the natural oxide film while suppressing the etching progress of the sidewall. Through this step, it is possible to remove most of the natural oxide film 230 at the bottom of the trench 220 while suppressing a loss of CD.

In this process, it is desirable to set the internal pressure of the process container 10 as low as possible in order to ensure the straightness of ions, and the process is performed under a predetermined low pressure atmosphere using both the turbo molecular pump and the dry pump constituting the exhauster 50. Furthermore, since this process is a plasma process, a low temperature atmosphere may be used, and the control of the heater 22 and the circulation of the refrigerant at the first flow rate are performed so that the first temperature of 30 degrees C. is maintained.

Figure 3C:
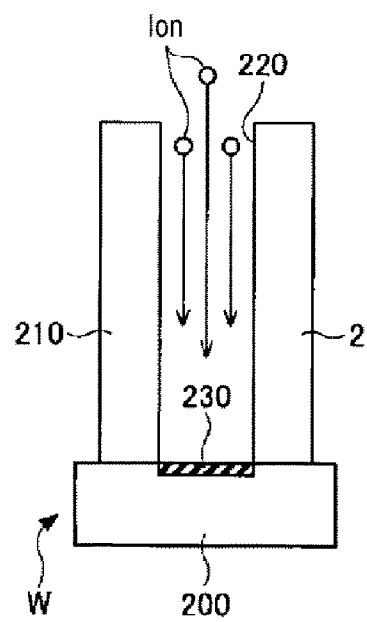

Next, as illustrated in FIG. 3C, with the wafer W kept at the first temperature while maintaining the state where the refrigerant at the first flow rate flows through the refrigerant passage 23, the carbon-based protective film 240 may be removed from the sidewall of the trench 220 by, for example, plasma such as a nitrogen trifluoride ($NF_3$) gas and an ammonia ($NH_3$) gas. This step is performed by generating plasma in the process space 46 by applying the high frequency power from the high frequency power supply 79 to the susceptor 21 while supplying, for example, a hydrogen ($H_2$) gas, from the processing gas supply 60 to the process space 46 in the process container 10 through the shower head 40.

Since this step is also a removal process by plasma, it is desirable that the processing pressure be low to some extent, but in order to remove the residue of the protective film 240 from the sidewall of the trench 220, it is desirable that the process be performed by lowering the setting of the straightness of the ion than that in FIG. 3B. Thus, the process is performed by setting the internal pressure of the process container 10 higher than that in FIG. 3B.

As described above, most of the natural oxide film 230 at the bottom of the trench 220 is removed by step S2, but the natural oxide film on the surface of the epitaxial growth portion having a complicated shape, for example, like the bottom of the trench of the fin FET, may not be completely removed by the anisotropic etching alone.

Figure 3D:
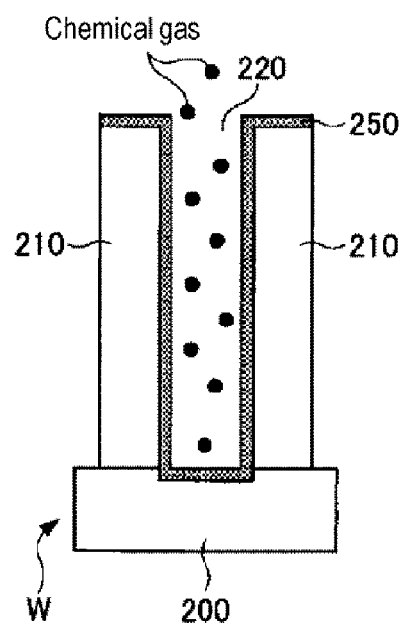

Therefore, in step S3, as illustrated in FIG. 3D, the remaining portion of the natural oxide film 230 is removed by a chemical etching process with the wafer W kept at the first temperature. Since the chemical etching is plasmaless, dry etching with a reactive gas and isotropic etching, it is possible to remove the natural oxide film 230 on the surface of the epitaxial growth portion having a complicated shape. In this example, a chemical oxide removal (COR) process using an ammonia ($NH_3$) gas and a hydrogen fluoride (HF) gas as a chemical gas is performed as the chemical etching.

During the COR process, the $NH_3$ gas and the HF gas are supplied from the process gas supply 60 to the process space 46 in the process container 10 through the shower head 40 in a state where no high frequency power is applied. In addition to the $NH_3$ gas and the HF gas, a rare gas such as an Ar gas or an inert gas such as an $N_2$ gas may be added as a dilution gas. Since the chemical etching such as the COR process is isotropic etching, the sidewall of the trench 220 may also be slightly etched, but as illustrated in FIG. 3C, since only the natural oxide film 230 slightly remaining at the bottom of the trench 220 is removed, the process for a short time is sufficient and thus the CD loss of the trench 220 hardly occurs.

During the COR process, the reaction product, which is mainly made of ammonium fluorosilicate [$(NH_4)_2SiF_6$; AFS]) is formed on the sidewall and the bottom of the trench 220 and the surface of the insulating film 210 by reaction of the $NH_3$ gas and the HF gas, is formed.

Therefore, as illustrated in FIG. 2, in step S4, the temperature of the susceptor 21 is adjusted from the first temperature of 30 degrees C. to the second temperature of 90 degrees C., and in step S5, a post heat treatment (PHT) process of subliming and removing the AFS as the reaction product at the second temperature is performed.

Here, as illustrated in FIGS. 4A and 4B, control for possibly shortening a time $\Delta t1$ (a time interval between the temperature rising start time t1 and time t2 when the temperature reaches the second temperature) required for step S4 of adjusting the temperature of the susceptor 21 from the first temperature to the second temperature is performed. Specifically, the controller 70 executes control to allow the refrigerant at the first flow rate (10 L/min) that maintains the set temperature of the chiller 81 at 20 degrees C. (which is an example of the set temperature) illustrated in FIGS. 4A and 4B to flow from the chiller 81 to the refrigerant passage 23. Furthermore, the controller 70 executes control to raise the temperature of the heater 22 from 30 degrees C. to 90 degrees C. during $\Delta t1$. By executing the control to raise the temperature of the heater 22 from 30 degrees C. to 90 degrees C. during $\Delta t1$ while allowing the refrigerant at the first flow rate to flow from the chiller 81 to the refrigerant passage 23 by the controller 70 in this way, it is possible to rapidly raise the temperature of the susceptor 21 while maintaining the temperature of the chiller 81 at the set temperature. In addition, if the temperature of the chiller 81 becomes higher than the set temperature due to the temperature rise of the susceptor 21, the cooling performance of the chiller 81 with respect to the refrigerant, which returns via the return passage 83, is deteriorated. As the cooling performance of the chiller 81 is lowered, time $\Delta 3$ (see FIG. 4B) required for step S6 of dropping the temperature of the susceptor 21 from the second temperature to the first temperature becomes longer, making it difficult to sufficiently promote shortening of the process time.

Figure 3E:
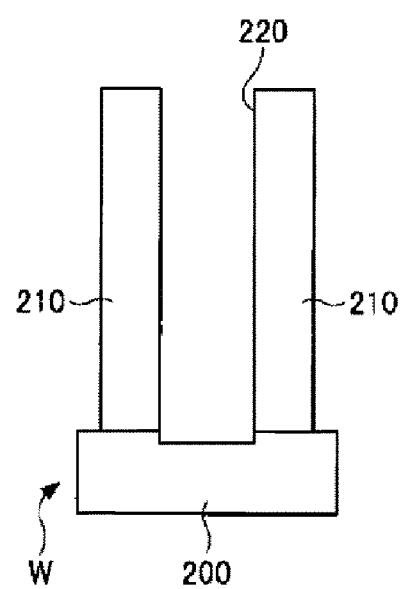

By performing the PHT process in step S5, as illustrated in FIG. 3E, the wafer W, from which the AFS has been removed from the sidewall and the bottom of the trench 220 and the surface of the insulating film 210 and the natural oxide film has been removed from the bottom of the trench 220, is obtained.

When the wafer W from which the natural oxide film has been removed is obtained from the bottom of the trench 220 by performing the PHT process in step S5, in order to perform the same process on a wafer W as a next process target, as illustrated in FIG. 2, the temperature of the susceptor 21 is adjusted from the second temperature to the first temperature in step S6. As illustrated in FIG. 4B, in step S6, the susceptor 21 begins to drop the temperature at time t4, reaches the first temperature at time t5, and the time interval from the time t4 to the time t5 is $\Delta t3$.

In an exemplary embodiment illustrated in FIG. 4A, the control for increasing the flow rate of the refrigerant from the first flow rate to the second flow rate starts at the time t2 that the temperature of the susceptor 21 rises to the second temperature. Then, as illustrated in FIGS. 4A and 4B, the flow rate of the refrigerant is increased to the second flow rate of 20 L/min at the intermediate time t3 of step S5 which is the second processing step. By increasing the flow rate of the refrigerant to the second flow rate while the temperature of the susceptor 21 is being adjusted to the second temperature in this way, it is possible to rapidly drop the temperature of the susceptor 21 to the first temperature in step S6 (the temperature drop at $\Delta t3$ in the drawing). In response to this control, for example, when the control to increase the flow rate of the refrigerant to the second flow rate starts at the time t4 when step S5 is completed, the time until the temperature of the susceptor 21 is dropped to the first temperature becomes longer than $\Delta t3$.

On the other hand, in an exemplary embodiment illustrated in FIGS. 4A and 4B, a control for dropping the temperature of susceptor 21 to be the first temperature via step S6, and then reducing the flow rate of the refrigerant from the second flow rate to the first flow rate at time t9. By rapidly reducing the flow rate of the refrigerant to the first flow rate after step S6 in this way, it is possible to adjust the temperature of the susceptor 21 to the first temperature suitable for the first processing step before the wafer W to be processed next is loaded into the process container 10, or after a short time from when it is loaded.

In step S6, the refrigerant at the second flow rate of 20 L/min is continuously provided to the refrigerant passage 23. According to the provision of such a refrigerant, the temperature of the heater 22 is controlled to be dropped from the second temperature of 90 degrees C. to the first temperature of 30 degrees C. By this control, the temperature of the susceptor 21 is adjusted to the first temperature at end time t5 of step S6. Here, in step S6, in addition to the temperature adjustment control of the heater 22 as illustrated, the OFF control of stopping the operation of the heater 22 may be executed.

In an exemplary embodiment illustrated in FIG. 4A, since time t10 at which the refrigerant flow rate reaches the first flow rate of 10 L/min is later than time t6 at which the series of processes illustrated in FIG. 4B are completed, the refrigerant flow rate is stabilized at the first flow rate after the wafer W to be processed next is loaded. In addition to the illustrated embodiment, the refrigerant flow rate may be controlled to be the first flow rate at the time t6 where the series of processes are completed (control to be t6=t10).

In the substrate processing method according to an embodiment, it is desirable to set the second temperature to fall within a range of 90 to 150 degrees C., and to set the difference value between the second temperature and the first temperature to fall within a range of 20 to 100 degrees C.

Since the second temperature is set at 90 degrees C. or higher, the sublimation process in step S5 can be realized. Meanwhile, since the second temperature is set at 150 degrees C. or lower, even when the chiller 81 with a predetermined rating is applied, the temperature of the chiller 81 can be kept at the set temperature of about 20 degrees C.

Furthermore, on the premise that the second temperature is set within a range of 90 to 150 degrees C., by setting the difference value between the second temperature and the first temperature to fall within a range of 20 to 100 degrees C., it is possible to realize the temperature rising time $\Delta t1$ and the temperature dropping time $\Delta t3$ as short as possible by the adjustment of the refrigerant flow rate and the adjustment by the heater heating. In addition, by setting the temperature rising time Δt1 and the temperature dropping time Δt3 as short as possible, it is possible to shorten the process time T0 until the time t6 required for the series of processes illustrated in FIGS. 4A and 4B, i.e., throughput, as much as possible.

Referring back to FIGS. 4A and 4B, the difference between the refrigerant flow rate control method and the temperature adjustment control method of the susceptor 21 (the electrostatic chuck 24 on the susceptor 21) in the substrate processing method (example) according to the embodiment and a conventional substrate processing method (comparative example), and the effects according to the example will be described.

The process sequence of the example and the comparative example illustrated in FIGS. 4A and 4B is a process sequence when sequentially executing the series of processes already described, that is, the natural oxide film removal process by plasma, the COR process and the PHT process. In the conventional substrate processing method according to the comparative example, as indicated by a dotted line in FIG. 4A, the flow rate of the refrigerant supplied from the chiller 81 to the refrigerant passage 23 is set at a constant value of the second flow rate. Therefore, even if the temperature of the heater 22 is raised with the same heater output as in the example, as illustrated in FIG. 4B, the temperature rising gradient of the susceptor 21 must be lower than in the example. The time required for step S4 in the example is Δt1, whereas the time required for step S4 in the comparative example is Δt2. According to the verification by the present inventors, it has been confirmed that Δt1 is shortened to about ½ of Δt2.

Furthermore, as indicated by a dotted line in FIG. 4A, when the flow rate of the refrigerant supplied from the chiller 81 to the refrigerant passage 23 is set at the constant value of the first flow rate, even if the temperature of the heater 22 is dropped with the same heater output as in the example, as illustrated in FIG. 4B, the temperature dropping gradient of the susceptor 21 must be lower than in the example. The time required for step S6 in the example is Δt3, whereas the time required for step S4 in the comparative example is Δt4, which affects the throughput. According to the verification by the present inventors, it has been confirmed that Δt3 is shortened to about ⅙ of Δt4.

As described above, according to the substrate processing method of the example against the comparative example, it is possible to significantly shorten the temperature adjustment time in both the time at which the temperature of the susceptor 21 is adjusted from the first temperature to the second temperature and the time at which the temperature of the susceptor 21 is adjusted from the second temperature to the first temperature. As a result, it has been confirmed that the process time T0 in the example can be shortened to about ½ of the process time T1 in the comparative example.

According to the substrate processing apparatus 100 of the embodiment and the substrate processing method to which the substrate processing apparatus 100 is applied, it is possible to sequentially perform the plurality of processes with different temperatures of the susceptor 21 in one process container 10 by changing the flow rate of the refrigerant and the output of the heater during the process. Furthermore, it is possible to shorten the throughput even while performing the plurality of processes with different temperatures of the susceptor 21 as described above in one process container 10.

<Substrate Processing Method Including First Embodiment>

Next, a contact forming method as a substrate processing method including the first embodiment will be described with reference to FIGS. 5 and 6A to 6C. Here, FIG. 5 is a flowchart of the substrate processing method including the first embodiment, and FIGS. 6A to 6C are cross-sectional process views illustrating respective steps of the flowchart of the substrate processing method including the first embodiment.

Figure 6B:
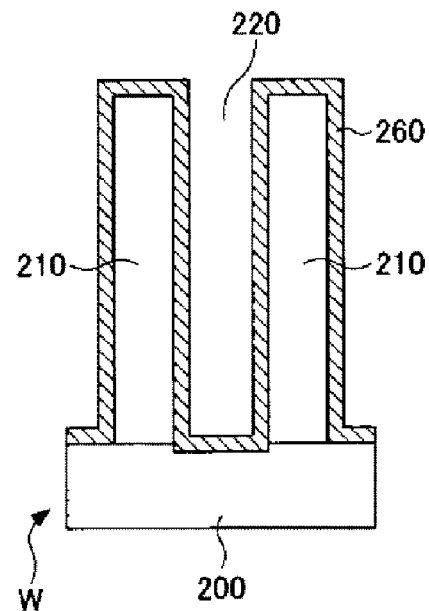

In the contact forming method according to the present embodiment, first, a natural oxide film containing silicon at the bottom of a trench 220 is removed by the substrate processing method according to the first embodiment, as illustrated in FIG. 6A (step S7 in FIG. 5). Thereafter, as illustrated in FIG. 6B, a metal film 260 which is a contact metal is formed by CVD or ALD (step S8 in FIG. 5). A Ti film, a Ta film, or the like may be used as the metal film 260.

Figure 6C:
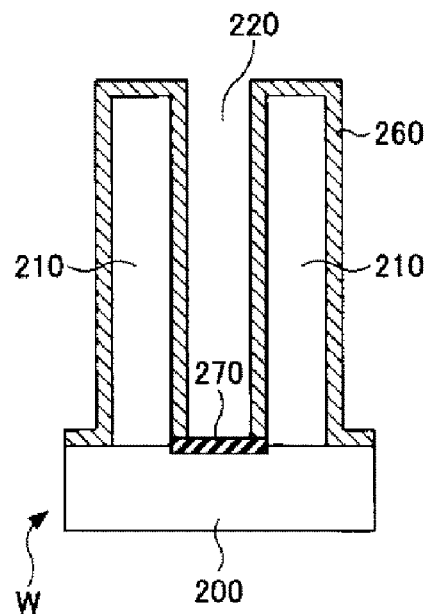

When the metal film 260 is formed in step S8, as illustrated in FIG. 6C, the metal film 260 reacts with silicon (silicon portion) at the bottom of the trench 220 to form a contact 270 made of a metal silicate (e.g., TiSi) in a self-aligning manner Second Embodiment <Substrate Processing Apparatus and Substrate Processing Method>

Figure 7:
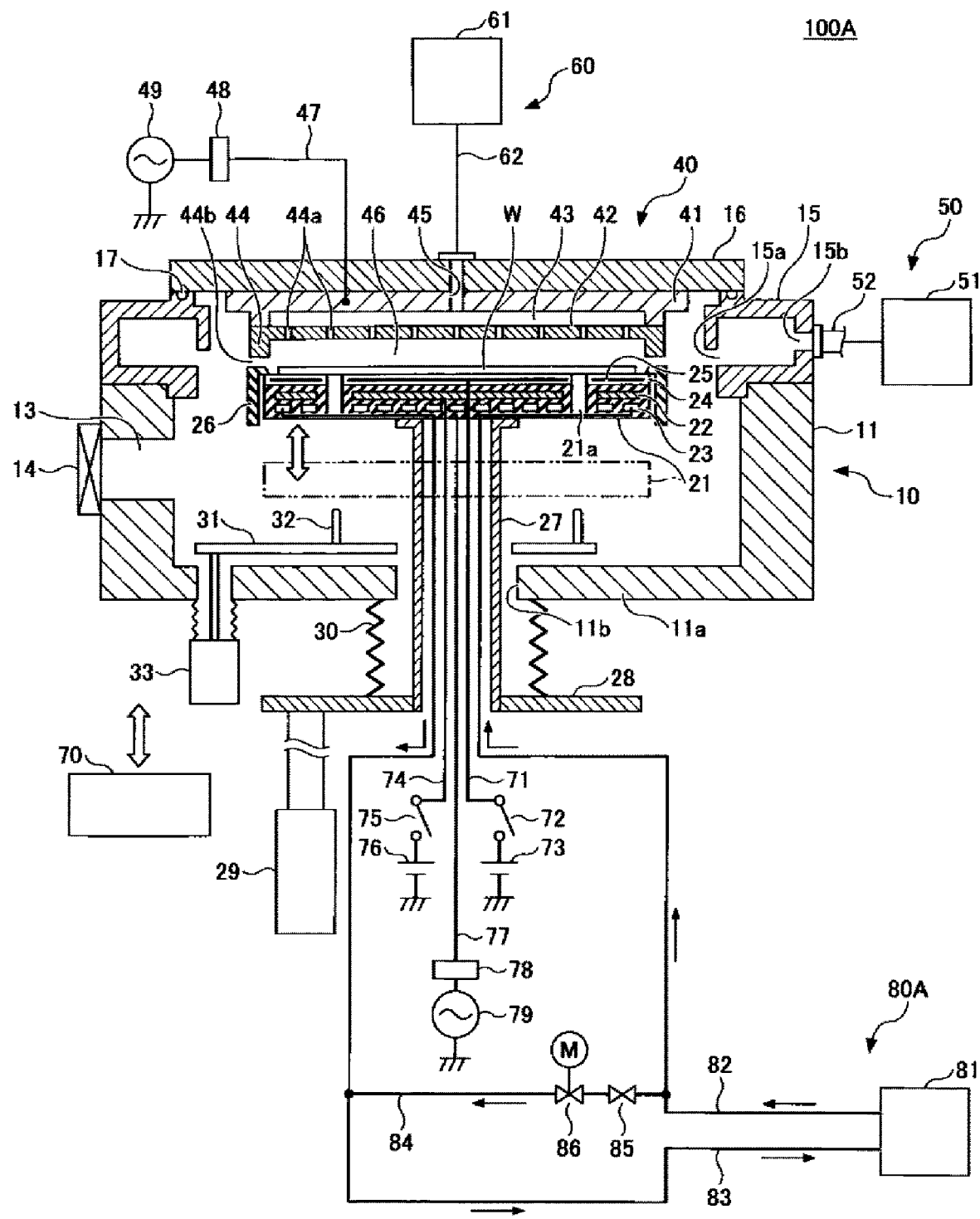
FIG. 7 is a cross-sectional view illustrating an example of an overall configuration of a substrate processing apparatus according to a second embodiment of the present disclosure.

Next, a substrate processing method and a substrate processing apparatus according to a second embodiment of the present disclosure will be described with reference to FIG. 7. FIG. 7 is a cross-sectional view illustrating an example of an overall configuration of the substrate processing apparatus according to the second embodiment.

In a substrate processing apparatus 100A according to the second embodiment, a bypass passage 84 configured to allow a feed passage 82 and a return passage 83 to be in fluid communication with each other is arranged in a cooler 80A without passing through the refrigerant passage 23. An opening/closing valve 85 and a flow rate control valve 86 are interposed in the bypass passage 84.

The flow rate of a refrigerant supplied from the chiller 81 to the refrigerant passage 23 is set at a constant value of, for example, 20 L/min, and when the refrigerant at the second flow rate is supplied to the refrigerant passage 23, the opening/closing valve 85 is controlled to be closed so that the refrigerant does not flow through the bypass passage 84. Meanwhile, when the refrigerant at the first flow rate is supplied to the refrigerant passage 23, the opening/closing valve 85 is controlled to be opened and the opening degree of the flow rate control valve 86 is adjusted and controlled so that the refrigerant of 10 L/min flows through the bypass passage 84. Thus, it is possible to supply the refrigerant at the first flow rate to the refrigerant passage 23. Furthermore, when reducing the refrigerant flow rate from the second flow rate to the first flow rate, a control for allowing a portion of the refrigerant to flow through the bypass passage 84 while actively reducing the refrigerant flow rate by the chiller 81 may be performed.

Instead of controlling the flow rate of the refrigerant supplied to the chiller 81 (pump constituting the chiller 81), by making the flow rate of the refrigerant supplied from the chiller 81 constant and controlling the flow rate of the refrigerant flowing through the bypass passage 84 in this way, it is possible to simplify the internal configuration of the chiller 81.

In the substrate processing method to which the substrate processing apparatus 100A is applied, when the temperature of the susceptor 21 is adjusted from the second temperature to the first temperature, a control for allowing a portion of the refrigerant to flow through the bypass passage 84 and reducing the flow rate of the refrigerant flowing through the refrigerant passage 23 is executed by the controller 70.

According to the present disclosure in some embodiments, it is possible to provide a method of processing a substrate and a substrate processing apparatus, which are advantageous for shortening throughput by reducing a temperature rising time and a temperature dropping time of a substrate mounting table, in performing a plurality of processes with different temperatures of the substrate mounting table.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate by a substrate processing apparatus comprising a substrate mounting table arranged in a process container and internally including a refrigerant passage through which a refrigerant flows and a heater, and a chiller configured to circulate the refrigerant with the refrigerant passage, the method comprising:

adjusting a temperature of the substrate mounting table to a first temperature to process the substrate; and adjusting the temperature of the substrate mounting table to a second temperature higher than the first temperature to process the substrate, wherein when the temperature of the substrate mounting table is adjusted from the first temperature to the second temperature, the refrigerant at a first flow rate for maintaining a set temperature of the chiller is allowed to flow from the chiller to the refrigerant passage, and the heater is operated so that the temperature of the substrate mounting table becomes the second temperature, and wherein when the temperature of the substrate mounting table is adjusted from the second temperature to the first temperature, the refrigerant at a second flow rate larger than the first flow rate is allowed to flow from the chiller to the refrigerant passage, and the heater is operated, or an operation of the heater is stopped so that the temperature of the substrate mounting table becomes the first temperature.

2. The method of claim 1, wherein a flow rate of the refrigerant is changed from the first flow rate to the second flow rate before the temperature of the substrate mounting table rises from the first temperature to become the second temperature or when the temperature of the substrate mounting table rises from the first temperature to become the second temperature.

3. The method of claim 1, wherein the temperature of the substrate mounting table is adjusted from the second temperature to the first temperature by lowering a heating temperature of the heater or stopping the operation of the heater in a state that a flow rate of the refrigerant is kept at the second flow rate.

4. The method of claim 1, wherein a feed passage configured to supply the refrigerant to the refrigerant passage and a return passage configured to return the refrigerant from the refrigerant passage to the chiller are in fluid communication with each other in the chiller, and a bypass passage configured to allow the feed passage and the return passage to be in fluid communication with each other without passing through the refrigerant passage is arranged, and wherein when the temperature of the substrate mounting table is adjusted from the second temperature to the first temperature, a flow rate of the refrigerant flowing through the refrigerant passage is reduced by allowing a portion of the refrigerant to flow through the bypass passage.

5. The method of claim 1, wherein the adjusting the temperature of the substrate mounting table to the first temperature includes a chemical etching process of chemical-etching the substrate by supplying a chemical gas into the process container, and wherein the adjusting the temperature of the substrate mounting table to the second temperature includes a removal process of removing a reaction product generated by the chemical etching process.

6. The method of claim 5, wherein the adjusting the temperature of the substrate mounting table to the first temperature includes a plasma etching process of plasma-etching the substrate by supplying a carbon-containing gas into the process container and plasmarizing the carbon-containing gas, and wherein, in the adjusting the temperature of the substrate mounting table to the first temperature, the plasma etching process and the chemical etching process are sequentially executed.

7. The method of claim 1, wherein the second temperature falls within a range of 90 to 150 degrees C., and a difference between the second temperature and the first temperature falls within a range of 20 to 100 degrees C.

8. The method of claim 1, wherein the substrate has an insulating film with a groove formed therein, and wherein the method further comprises removing a silicon-containing oxide film which is a natural oxide film formed at a bottom of the groove in one process container in the adjusting the temperature of the substrate mounting table to the first temperature and the adjusting the temperature of the substrate mounting table to the second temperature.

9. The method of claim 8, further comprising:

in the one process container, removing the natural oxide film;

forming a metal film after removing the natural oxide film; and reacting a silicon portion at the bottom of the groove with the metal film to form a contact at the bottom of the groove.

10. The method of claim 9, wherein in the forming the metal film, the metal film is formed by CVD or ALD.

11. The method of claim 8, wherein the groove is a trench or a hole.

* * * * *